(12) United States Patent
Houston

(10) Patent No.: US 8,179,715 B2
(45) Date of Patent: May 15, 2012

(54) 8T SRAM CELL WITH FOUR LOAD TRANSISTORS

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 262 days.

(21) Appl. No.: 12/782,908

(22) Filed: May 19, 2010

(65) Prior Publication Data

US 2010/0296337 A1 Nov. 25, 2010

Related U.S. Application Data

(60) Provisional application No. 61/180,307, filed on May 21, 2009.

(51) Int. Cl.
*G11C 11/00* (2006.01)
(52) U.S. Cl. .................. 365/154; 365/156; 365/189.011; 365/189.11

(58) Field of Classification Search .................. 365/154, 365/156, 189.011, 189.11, 230.05, 230.06
See application file for complete search history.

(56) References Cited

U.S. PATENT DOCUMENTS 7,589,993 B2 * 9/2009 Yamaoka et al. ............. 365/154
* cited by examiner

*Primary Examiner* — David Lam
(74) *Attorney, Agent, or Firm* — Rose Alyssa Keagy; Wade J. Brady, III; Frederick J. Telecky, Jr

(57) ABSTRACT

An integrated circuit containing SRAM cells with auxiliary load transistors on each data node. The integrated circuit also contains circuitry so that auxiliary load transistors in addressed SRAM cells may be biased independently of half-addressed cells. A process of operating an integrated circuit containing SRAM cells with auxiliary load transistors on each data node. The process includes biasing the auxiliary load transistors in addressed SRAM cells independently of half-addressed cells.

20 Claims, 9 Drawing Sheets

8T SRAM CELL WITH FOUR LOAD TRANSISTORS

CROSS-REFERENCE TO RELATED APPLICATIONS

This application claims the benefit of priority under U.S.C. §119(e) of U.S. Provisional Application 61/180,307 (entitled "An 8T SRAM Cell with 4 Load Transistors"), filed May 21, 2009, the entirety of which is incorporated herein by reference.

Furthermore, this application is related to:
Patent application Ser. No. 12/782,874 (filed May 19, 2010) entitled "6T SRAM Cell With Single Sided Write,"
Patent application Ser. No. 12/782,894 (filed May 19, 2010) entitled "Asymmetric SRAM Cell With Split Transistors On The Strong Side,"
Patent application Ser. No. 12/782,902 (filed May 19, 2010) entitled "8T SRAM Cell With Two Single-Sided Ports,"
Patent application Ser. No. 12/782,941 (filed May, 19, 2010) entitled "8T SRAM Cell With One Word Line," and
Patent application Ser. No. 12/782,927 (filed May 19, 2010) entitled "SRAM Cell For Single Sided Write."

With their mention in this section, these patent applications are not admitted to be prior art with respect to the present invention; patent application Ser. No. 12/782,908 (filed May 19, 2010).

FIELD OF THE INVENTION

This invention relates to the field of integrated circuits. More particularly, this invention relates to static random access memories (SRAMs) in integrated circuits.

DETAILED DESCRIPTION

Figure 1:
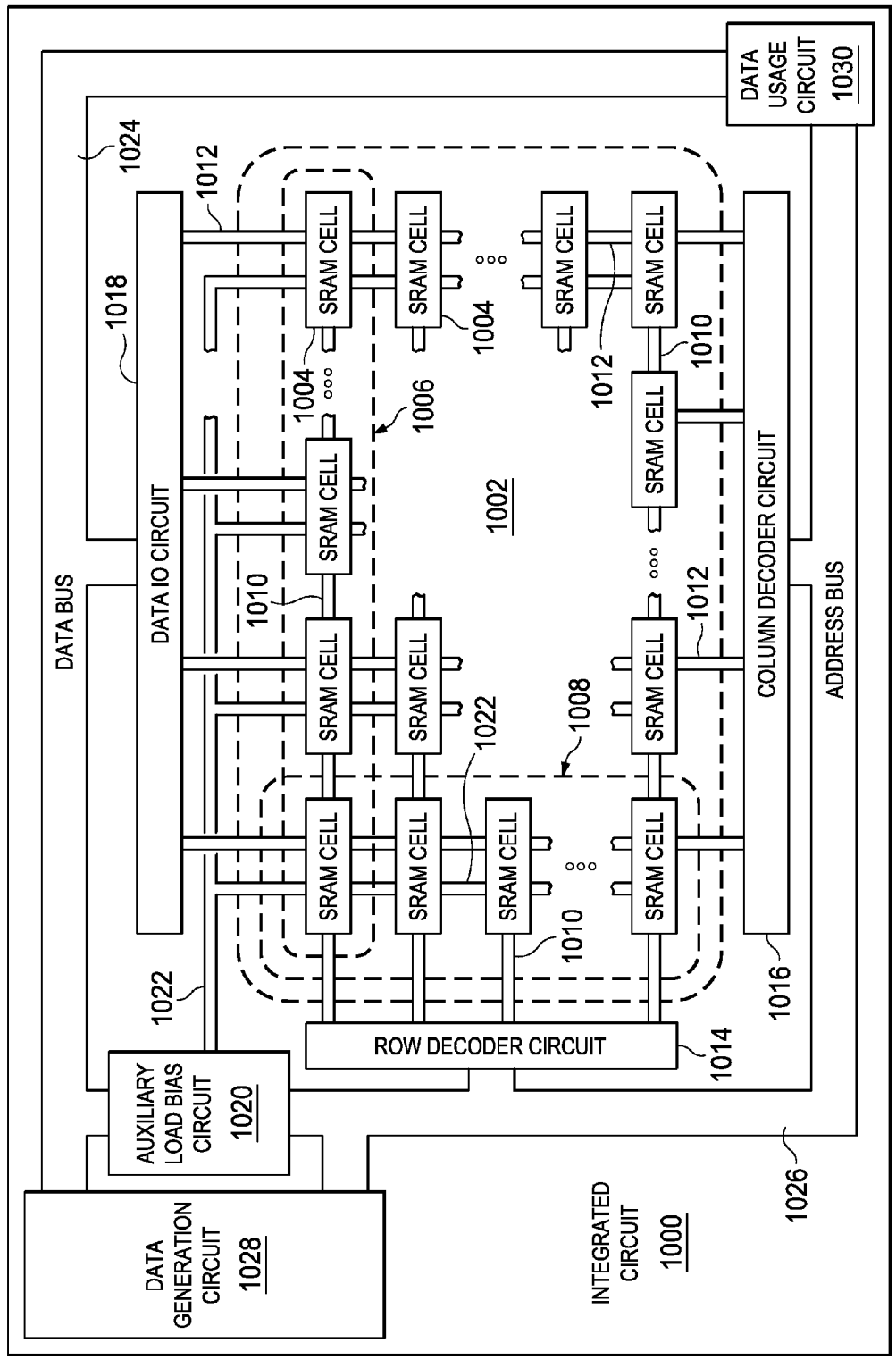
FIG. 1 depicts an integrated circuit containing an SRAM cell array which includes SRAM cells formed according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

For the purposes of this disclosure, the term "Vtn" is understood to mean an average threshold voltage of NMOS transistors in inverters of SRAM cells. The term "Vtp" is understood to mean an average threshold voltage magnitude of PMOS transistors in inverters of SRAM cells.

In this disclosure, the term "driver transistor" is understood to refer to a metal oxide semiconductor (MOS) transistor, possibly a finFET transistor or a carbon nanotube transistor (CNT), in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor; that is, SRAM cells in arrays which pre-charge data lines to a high voltage have NMOS driver transistors, while SRAM cells in arrays which pre-charge data lines to a low voltage have PMOS driver transistors.

Similarly, the term "load transistor" is understood to refer to another MOS transistor, possibly a finFET transistor or a CNT, in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS load transistors or Vss for NMOS load transistors. A polarity of the load transistor source node power supply is the same as the polarity of a read operation pre-charge potential of a corresponding data line which is connected to the driver transistor through a passgate transistor; that is, SRAM cells in arrays which pre-charge data lines to a potential above Vss have PMOS load transistors, while SRAM cells in arrays which pre-charge data lines to a potential below Vdd have NMOS load transistors.

The term "passgate transistor" is understood to refer to yet another MOS transistor, possibly a finFET transistor or a CNT, in the SRAM cell, of which one source/drain node is connected to a data node of the SRAM cell and an opposite source/drain node is connected to a corresponding data line of the SRAM cell. Similarly, the term "access transistor" is understood to refer to an MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

The term "word line" is understood to mean an interconnect element connected to gate nodes of passgate transistors and/or access transistors in a row of SRAM cells. The terms "bit line" and "bit-bar line" are understood to refer to data lines connected to passgate transistors or read buffers in a column of SRAM cells.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while a bit line is disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, such as microprocessors, digital signal processors and wireless telephony controllers, circuits which provide data to be stored in the SRAM array and circuits which use data from the SRAM array are located in the integrated circuit.

An integrated circuit may contain an array of SRAM cells arranged in rows and columns. Each SRAM cell may contain cross-coupled inverters in which each inverter includes a driver transistor, a load transistor and an auxiliary load transistor. In one embodiment, the source nodes of the auxiliary load transistors may be biased by column, independently of the load transistors. In another embodiment, the bit-side and bit-bar-side auxiliary load transistors may be biased independently of each other and independently of the load transistors.

During write operations, source nodes of the auxiliary load transistors in addressed SRAM cells may be floated to reduce interference with data transfer from bit lines to the addressed SRAM cells, or may be biased independently to assist data transfer from bit lines to data nodes in the addressed SRAM cells. Alternately, a source node of one auxiliary load transistor in an addressed SRAM cell may be biased while a source node of an opposite auxiliary load transistor in the addressed SRAM cell may be floated or biased to a different voltage to increase a write margin. Source nodes of the auxiliary load transistors in half-addressed SRAM cells are biased to reduce data inversion during the write operations.

During read operations, source nodes of the auxiliary load transistors in addressed SRAM cells may be biased to improve static noise margin values in the addressed SRAM cells. Source nodes of the auxiliary load transistors in half-addressed SRAM cells may be biased to reduce data inversion as passgate transistors are turned on during the read operations.

During standby modes, in which biases on source nodes of the driver and load transistors are maintained at potentials substantially equivalent to those during read and write operations, source nodes of the auxiliary load transistors may be floated to reduce leakage current in the SRAM cells.

During sleep modes, in which potential difference across the driver and load transistors are lowered to reduce power consumption in the SRAM cell array, source nodes of the auxiliary load transistors may be biased at reduced potentials to improve data retention in the SRAM cells or floated to reduce leakage current in the SRAM cell array.

FIG. 1 depicts an integrated circuit (1000) containing an SRAM cell array (1002) which includes SRAM cells (1004) formed according to an embodiment. The SRAM cells (1004) are arranged in rows (1006) and columns (1008). Each word line (1010) is connected to SRAM cells (1004) in a row (1006). Each bit line bus (1012) is connected to SRAM cells (1004) in a column (1008). Each bit line bus (1012) may include one or more bit or bit-bar lines. A row decoder circuit (1014) applies appropriate biases to word lines (1010). A column decoder circuit (1016) applies appropriate biases to bit or bit-bar lines in the bit line buses (1012). A data input/output (IO) circuit (1018) reads data from the bit or bit-bar lines in the bit line buses (1012) during read operations and applies appropriate potentials to the bit or bit-bar lines in the bit line buses (1012) during write operations. An auxiliary load bias circuit (1020) applies biases to an auxiliary load bus (1022) which is connected to auxiliary load transistors in the SRAM cells (1004). The auxiliary load bias circuit (1020) is capable of biasing the auxiliary load transistors independently by column. In one realization of the instant embodiment, the auxiliary load bias circuit (1020) may be capable of biasing or floating each auxiliary load transistor in an addressed SRAM cell independently. The integrated circuit further includes a data bus (1024) which carries data bits between the SRAM cell array (1002) and other circuits in the integrated circuit (1000). In addition, the integrated circuit includes an address bus (1026) which is used to select SRAM cells (1004) in the SRAM cell array (1002) for read and write operations. The address bus (1026) is connected to the row decoder circuit (1014), the column decoder circuit (1016) and the auxiliary load bias circuit (1020). The integrated circuit (1000) may also contain a data generation circuit (1028) which connects to the data bus (1024) and address bus (1026). The data generation circuit (1028) produces incoming data bits for storage in the SRAM cell array (1002). The data bus (1024) carries the incoming data bits from the data generation circuit (1028) to the SRAM cell array (1002). The integrated circuit (1000) may also contain a data usage circuit (1030) which connects to the data bus (1024) and address bus (1026). The data usage circuit (1030) uses outgoing data bits which were stored in the SRAM cell array (1002). The data bus (1024) carries the outgoing data bits from the SRAM cell array (1002) to the data usage circuit (1030).

Figure 2:
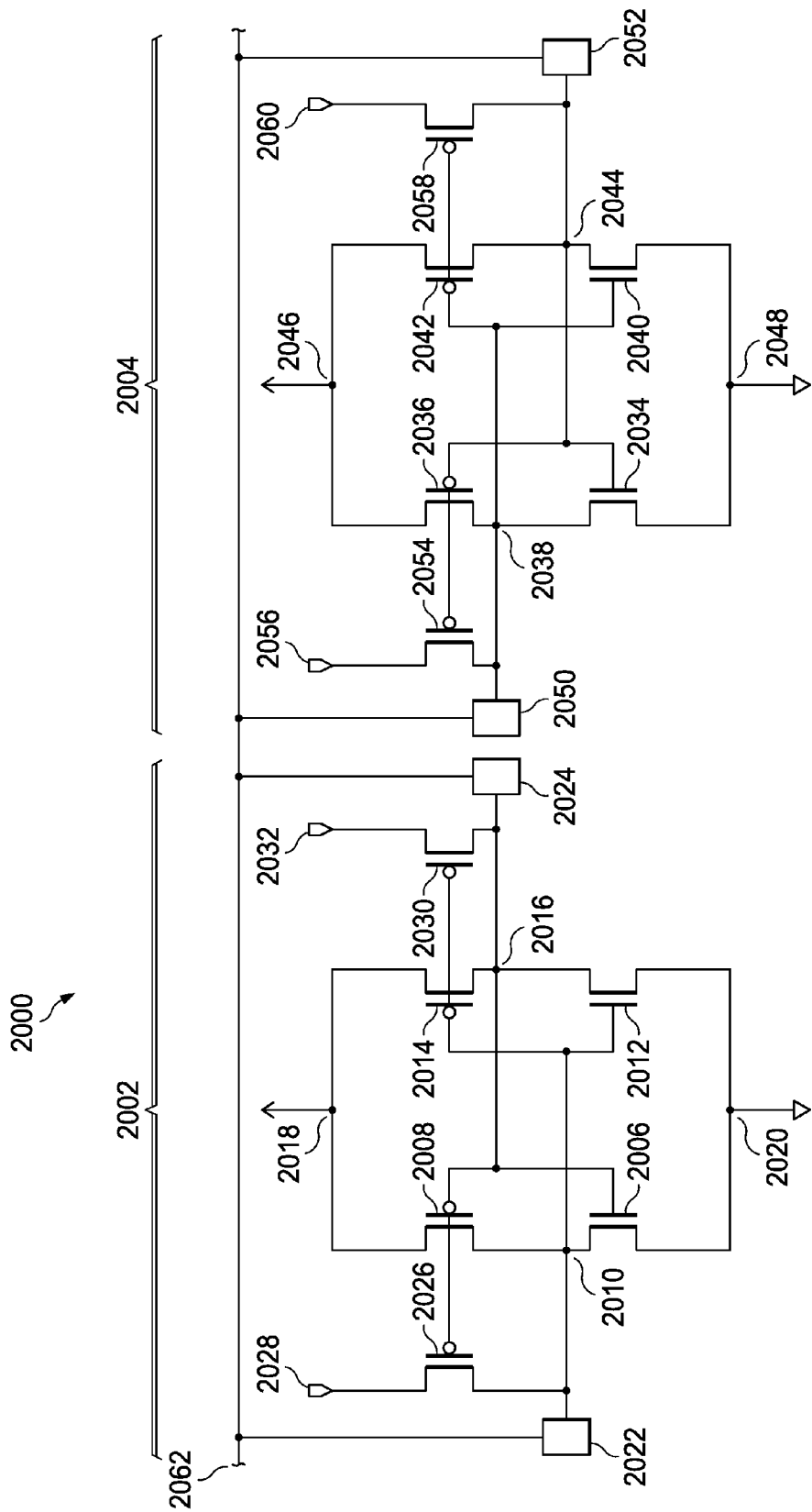
FIG. 2 is a circuit diagram of an SRAM cell array.

FIG. 2 is a circuit diagram of a portion of an SRAM cell array (2000) in an integrated circuit. The SRAM cell array (2000) contains a first SRAM cell (2002) and a second SRAM cell (2004). The first SRAM cell (2002) includes an NMOS first bit-side driver transistor (2006) commonly known as a first bit driver (2006) and a PMOS first bit-side load transistor (2008) commonly known as a first bit load (2008). A drain node of the first bit driver (2006) and a drain node of the first bit load (2008) are connected to a first bit-side data node (2010). The first SRAM cell (2002) also includes an NMOS first bit-bar-side driver transistor (2012) commonly known as a first bit-bar driver (2012) and a PMOS first bit-bar-side load transistor (2014) commonly known as a first bit-bar load (2014). A drain node of the first bit-bar driver (2012) and a drain node of the first bit-bar load (2014) are connected to a first bit-bar-side data node (2016). A source node of the first bit load (2008) and a source node of the first bit-bar load (2014) are connected to a first Vdd node (2018). A source node of the first bit driver (2006) and a source node of the first bit-bar driver (2012) are connected to a first Vss node (2020). A gate node of the first bit driver (2006) and a gate node of the first bit load (2008) are connected to the first bit-bar-side data node (2016). Similarly, a gate node of the first bit-bar driver (2012) and a gate node of the first bit-bar load (2014) are connected to the first bit-side data node (2010). The first bit driver (2006) and the first bit load (2008), with connected gate nodes, form a first bit inverter. Similarly, the first bit-bar driver (2012) and the first bit-bar load (2014), with connected gate nodes, form a first bit-bar inverter.

The first bit-side data node (2010) is connected to a first bit-side data access circuit (2022), which may include one or more passgate transistors and possibly one or more read buffers, connected to one or more bit lines (not shown). Similarly, the first bit-bar-side data node (2016) may be connected to an optional first bit-bar-side data access circuit (2024), which may include one or more passgate transistors and possibly one or more read buffers, connected to one or more bit-bar lines (not shown).

The first SRAM cell (2002) also includes a PMOS first bit-side auxiliary load transistor (2026). A drain node of the first bit-side auxiliary load transistor (2026) is connected to the first bit-side data node (2010). A gate node of the first bit-side auxiliary load transistor (2026) is connected to the first bit-bar-side data node (2016). A source node (2028) of the first bit-side auxiliary load transistor (2026) is connected to other source nodes of other bit-side auxiliary load transistors (not shown) in a same column as the first SRAM cell (2002), and may be biased independently of the first Vdd node (2018).

The first SRAM cell (2002) also includes a PMOS first bit-bar-side auxiliary load transistor (2030). A drain node of the first bit-bar-side auxiliary load transistor (2030) is connected to the first bit-bar-side data node (2016). A gate node of the first bit-bar-side auxiliary load transistor (2030) is connected to the first bit-side data node (2010). A source node (2032) of the first bit-bar-side auxiliary load transistor (2030) is connected to other source nodes of other bit-bar-side auxiliary load transistors (not shown) in a same column as the first SRAM cell (2002), and may be biased independently of the first Vdd node (2018).

In one embodiment, a sum of on-state currents of the first bit load (2008) and the first bit-side auxiliary load transistor (2026) is substantially equal to an on-state current of the first bit driver (2006). Similarly, a sum of on-state currents of the first bit-bar load (2014) and the first bit-bar-side auxiliary load transistor (2030) is substantially equal to an on-state current of the first bit-bar driver (2012). In another embodiment, the driver transistors (2006, 2012) and the load transistors (2008, 2014) may be a minimum width consistent with the fabrication methods used to manufacture the SRAM cell array (2000). Minimizing driver and load transistor widths may reduce a size of the SRAM cell array (2000) and thereby may reduce manufacturing costs of the integrated circuit. In one embodiment, a magnitude of a threshold voltage of the first bit-side auxiliary load transistor (2026) may be more than 25 millivolts less than a magnitude of a threshold of the first bit load (2008), and a magnitude of a threshold voltage of the first bit-bar-side auxiliary load transistor (2030) may be more than 25 millivolts less than a magnitude of a threshold of the first bit-bar load (2014) for the purpose of increasing the on-state currents of the first bit-side auxiliary load transistor (2026) and the first bit-bar-side auxiliary load transistor (2030). In one embodiment, the source node (2028) of the first bit-side auxiliary load transistor (2026) and the source node (2032) of the first bit-bar-side auxiliary load transistor (2030) may be connected to the auxiliary load bias circuit (1020) of FIG. 1.

The second SRAM cell (2004) includes a second bit driver (2034) and a second bit load (2036) connected at a second bit-side data node (2038) as in the first SRAM cell (2002). Similarly, the second SRAM cell (2004) includes a second bit-bar driver (2040) and a second bit-bar load (2042) connected at a second bit-bar-side data node (2044). Gate nodes of the second bit driver (2034) and second bit load (2036) are connected to the second bit-bar-side data node (2044). Similarly, gate nodes of the second bit-bar driver (2040) and second bit-bar load (2042) are connected to the second bit-side data node (2038). Source nodes of the second bit load (2036) and second bit-bar load (2042) are connected to a second Vdd node (2046). Source nodes of the second bit driver (2034) and second bit-bar driver (2040) are connected to a second Vss node (2048). The second bit-side data node (2038) is connected to a second bit-side data access circuit (2050) similar to the first bit-side data access circuit (2022). The second bit-bar-side data node (2044) is configured similarly to the first bit-bar-side data node (2016), including a possible second bit-bar-side data access circuit (2052). A second bit-side auxiliary load transistor (2054) is configured similarly to the first bit-side auxiliary load transistor (2026). A source node (2056) of the second bit-side auxiliary load transistor (2054) is connected to other source nodes of other bit-side auxiliary load transistors (not shown) in a same column as the second SRAM cell (2004). A second bit-bar-side auxiliary load transistor (2058) is configured similarly to the first bit-bar-side auxiliary load transistor (2030). A source node (2060) of the second bit-bar-side auxiliary load transistor (2058) is connected to other source nodes of other bit-bar-side auxiliary load transistors (not shown) in a same column as the second SRAM cell (2004). The source node (2056) of the second bit-side auxiliary load transistor (2054) and the source node (2060) of the second bit-bar-side auxiliary load transistor (2058) may be biased independently of the second Vdd node (2046).

In an alternate realization, the driver transistors (2006, 2012, 2034, 2040), the load transistors (2008, 2014, 2036, 2042) and the auxiliary load transistors (2026, 2030, 2054, 2058) may be finFET transistors or CNTs. Forming the SRAM cell array (2000) with finFET transistors or CNTs may reduce a size of the SRAM cell array (2000) and reduce manufacturing costs of an integrated circuit containing the SRAM cell array (2000).

A word line (2062) is connected to the first bit-side data access circuit (2022), the first bit-bar-side data access circuit (2024), if present, the second bit-side data access circuit (2050) and the second bit-bar-side data access circuit (2052), if present.

FIG. 3A through FIG. 3E are flowcharts of a write low operation, a write high operation, a read operation, a transition to standby mode and a transition to sleep mode, respectively. The flowcharts in FIG. 3A through FIG. 3E refer to an SRAM cell array such as the SRAM cell array depicted in FIG. 2. In a standby mode, no write or read operations are performed, while bias levels to source nodes of driver and load transistors in SRAM cells are maintained at substantially same levels as applied during write and read operations, to enable rapid transition from standby mode to write or read operations. In a sleep mode, no write or read operations are performed, while voltage levels across driver and load transistors in SRAM cells are lowered to reduce power consumption of the SRAM cells.

Figure 3A:
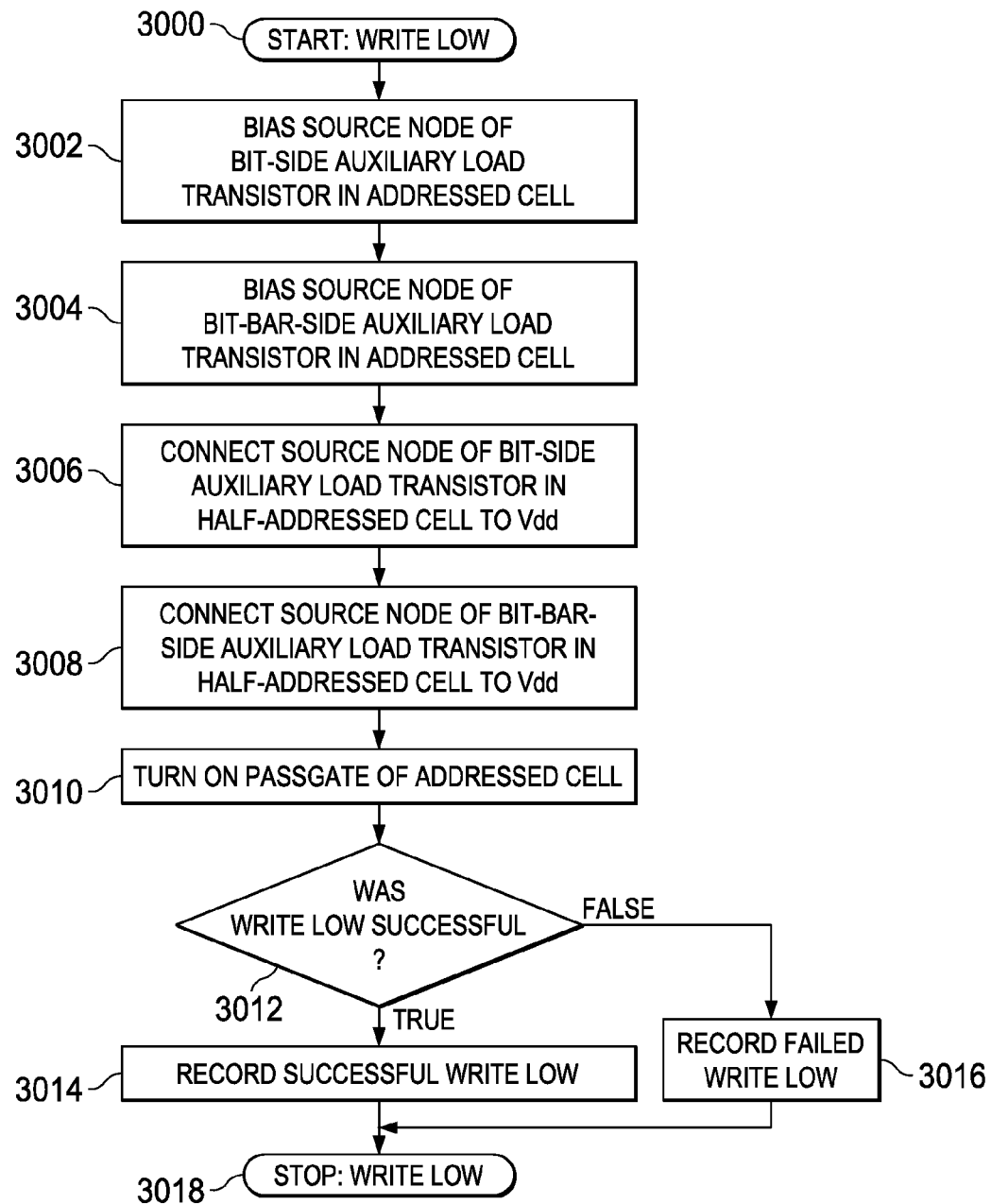
FIG. 3A through FIG. 3E are flowcharts of a write low operation, a write high operation, a read operation, a transition to standby mode and a transition to sleep mode, respectively.

Referring to FIG. 3A, the write low operation begins (3000) with step (3002) which is to bias a source node of a bit-side auxiliary load transistor in an addressed SRAM cell. In one embodiment, the source node of the addressed bit-side auxiliary load transistor may be connected to Vss. In another embodiment, the source node of the addressed bit-side auxiliary load transistor may be floated.

Step (3004) is executed, which is to bias a source node of a bit-bar-side auxiliary load transistor in the addressed SRAM cell. In one embodiment, the source node of the addressed bit-bar-side auxiliary load transistor may be connected to Vdd. In another embodiment, the source node of the addressed bit-bar-side auxiliary load transistor may be floated. In yet a further embodiment, the source node of the addressed bit-bar-side auxiliary load transistor may be connected to Vss.

Step (3006) is executed, which is to connect a source node of a bit-side auxiliary load transistor in a half-addressed SRAM cell to Vdd. Step (3008) is executed, which is to connect a source node of a bit-bar-side auxiliary load transistor in a half-addressed SRAM cell to Vdd. Step (3010) is executed, which is to turn on a passgate transistor in a bit-side data access circuit (such as passgate transistor (6012) shown in FIG. 6)), and a passgate transistor in a bit-bar-side data access circuit, if present, in the addressed SRAM cell.

In realizations of the write low operation which are part of test operations, following execution of step (3010), step (3012) is executed, which is to determine if a voltage substantially equal to Vss, hereafter referred to as a low voltage, was successfully transferred to a bit-side data node and to determine if there was a data upset in the half-addressed SRAM cell (e.g. if the voltage level of the bit-side data node of the half-addressed SRAM cell was switched). If the low voltage was successfully transferred to the bit-side data node and there was no data upset in the half-addressed SRAM cell then step (3014) is executed, which is to record a successful write low operation for the addressed SRAM cell. If the low voltage was not successfully transferred to the bit-side data node or there was a data upset in the half-addressed SRAM cell then step (3016) is executed, which is to record a failed write low operation for the addressed SRAM cell. After step (3014) or step (3016) is executed, or after step (3010) is executed in realizations which are not part of test operations, the write low operation is ended (3018). In other realizations of the write low operation, steps (3002), (3004), (3006) and (3008) may be performed in any order.

Figure 3B:
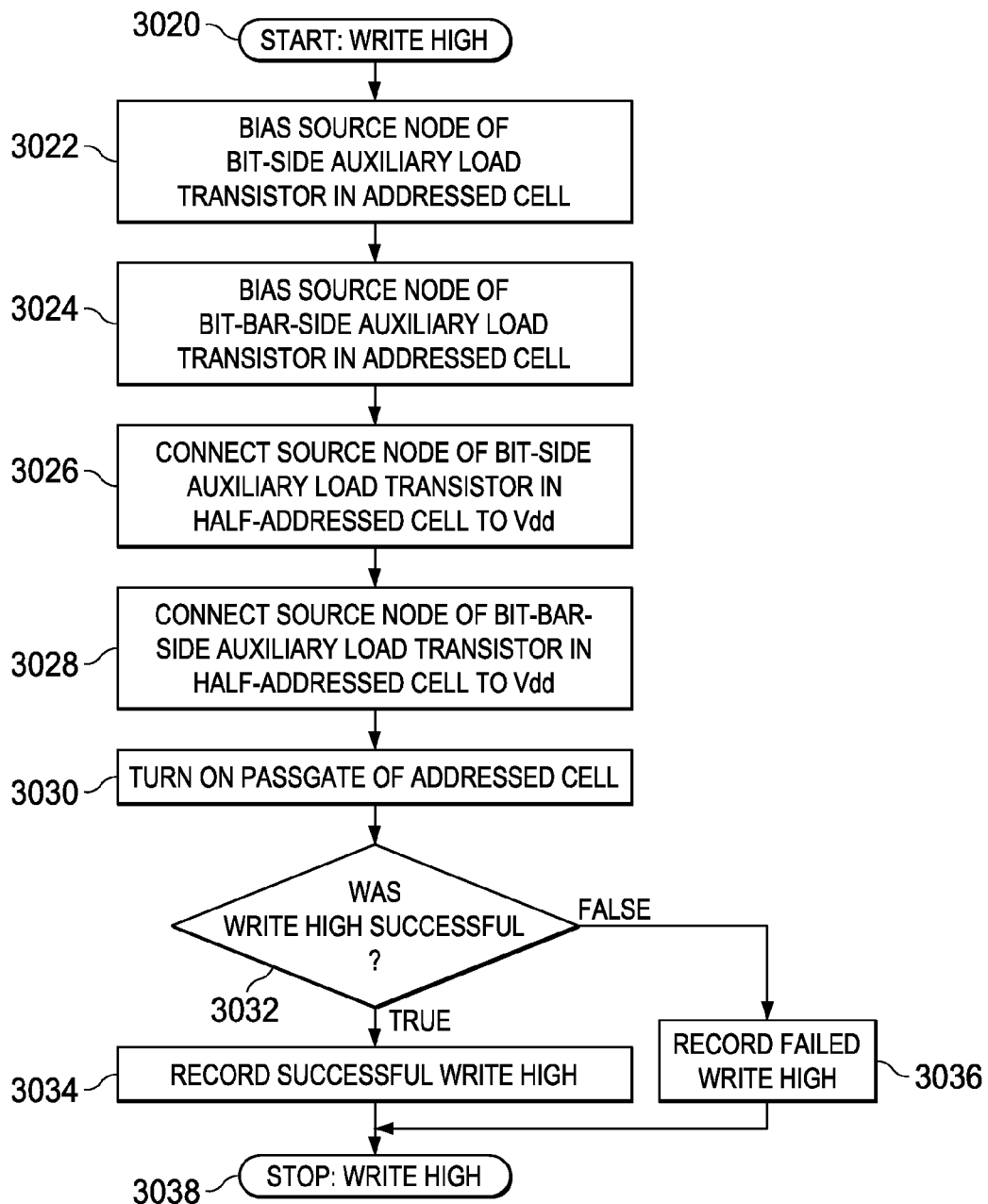

Referring to FIG. 3B, the write high operation begins (3020) with step (3022) which is to bias a source node of a bit-side auxiliary load transistor in an addressed SRAM cell. In one embodiment, the source node of the addressed bit-side auxiliary load transistor may be connected to Vdd. In another embodiment, the source node of the addressed bit-side auxiliary load transistor may be floated. In yet a further embodiment, the source node of the addressed bit-side auxiliary load transistor may be connected to Vss.

Step (3024) is executed, which is to bias a source node of a bit-bar-side auxiliary load transistor in the addressed SRAM cell. In one embodiment, the source node of the addressed bit-bar-side auxiliary load transistor may be connected to Vss. In another embodiment, the source node of the addressed bit-bar-side auxiliary load transistor may be floated.

Step (3026) is executed, which is to connect a source node of a bit-side auxiliary load transistor in a half-addressed SRAM cell to Vdd. Step (3028) is executed, which is to connect a source node of a bit-bar-side auxiliary load transistor in a half-addressed SRAM cell to Vdd. Step (3030) is executed, which is to turn on a passgate transistor in a bit-side data access circuit, and a passgate transistor in a bit-bar-side data access circuit, if present, in the addressed SRAM cell.

In realizations of the write high operation which are part of test operations, following execution of step (3030), step (3032) is executed, which is to determine if a potential substantially equal to Vdd, hereafter referred to as a high voltage, was successfully transferred to a bit-side data node and to determine if there was a data upset in the half-addressed SRAM cell (e.g. if the voltage level of the bit-side data node of the half-addressed SRAM cell was switched). If the high voltage was successfully transferred to the bit-side data node and there was no data upset in the half-addressed SRAM cell then step (3034) is executed, which is to record a successful write high operation for the addressed SRAM cell. If the high voltage was not successfully transferred to the bit-side data node or there was a data upset in the half-addressed SRAM cell then step (3036) is executed, which is to record a failed write high operation for the addressed SRAM cell. After step (3034) or step (3036) is executed, or after step (3030) is executed in realizations which are not part of test operations, the write high operation is ended (3038). In other realizations of the write high operation, steps (3022), (3024), (3026) and (3028) may be performed in any order.

Figure 3C:
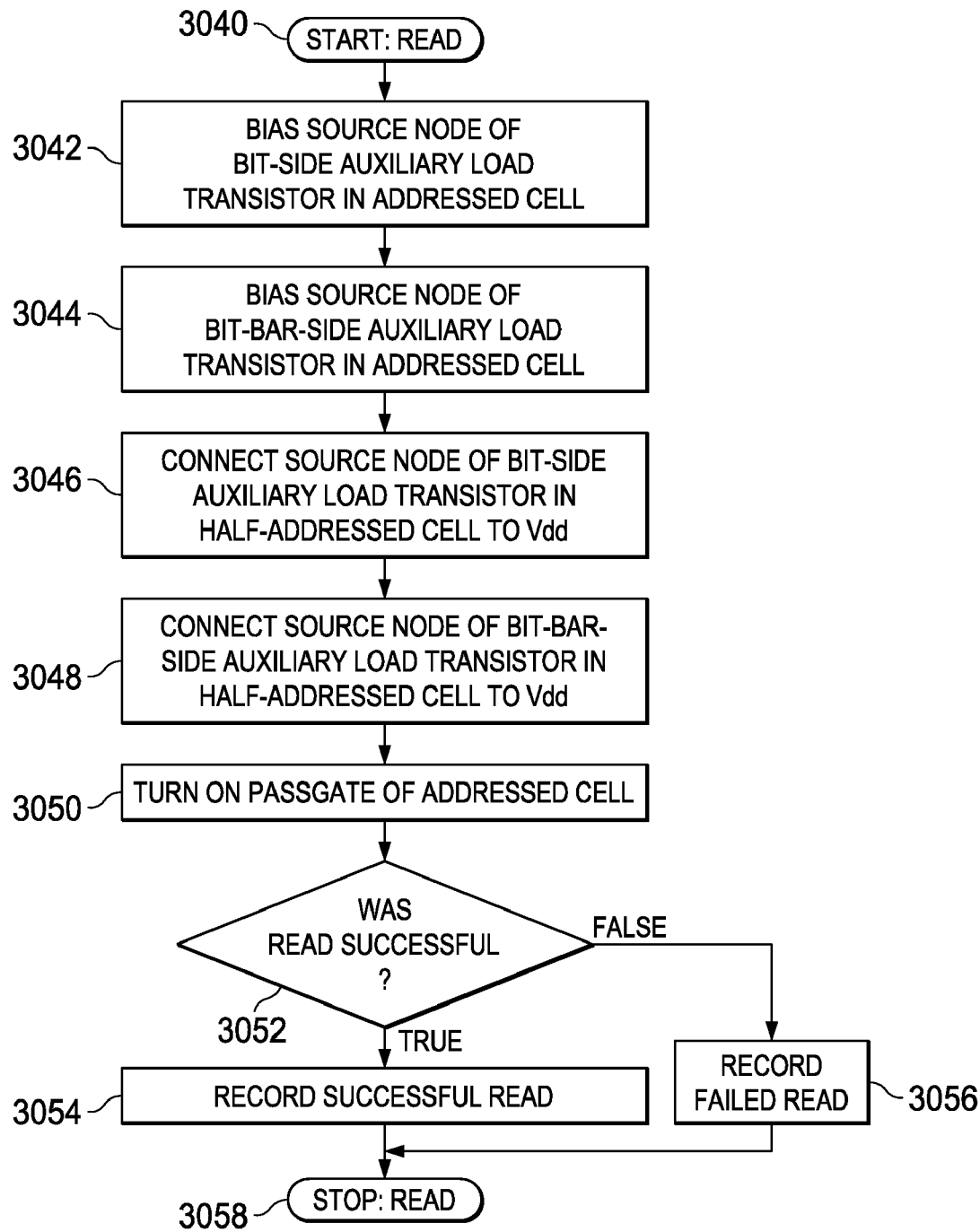

Referring to FIG. 3C, the read operation begins (3040) with step (3042) which is to bias a source node of a bit-side auxiliary load transistor in an addressed SRAM cell. In realizations of the SRAM cells in which read operations include potentials on data nodes between driver and load transistors passing through passgate transistors connected to bit lines (see, for example FIG. 6), the source node of the addressed bit-side auxiliary load transistor may be connected to Vdd. In realizations of the SRAM cells in which read operations include driving read buffers connected to bit lines (see, for example FIG. 6), the source node of the addressed bit-side auxiliary load transistor may be floated. In yet further realizations of the read operation in SRAM cells having read buffers, the source node of the addressed bit-side auxiliary load transistor may be connected to Vss.

Step (3044) is executed, which is to bias a source node of a bit-bar-side auxiliary load transistor in the addressed SRAM cell. In realizations involving passing data through passgate transistors connected to bit lines, the source node of the addressed bit-bar-side auxiliary load transistor may be connected to Vdd. In realizations involving reading data from read buffers, the source node of the addressed bit-bar-side auxiliary load transistor may be floated. In yet further realizations involving reading data from read buffers, the source node of the addressed bit-bar-side auxiliary load transistor may be connected to Vss.

Step (3046) is executed, which is to connect a source node of a bit-side auxiliary load transistor in a half-addressed SRAM cell to Vdd. Step (3048) is executed, which is to connect a source node of a bit-bar-side auxiliary load transistor in a half-addressed SRAM cell to Vdd. Step (3050) is executed, which is to turn on a passgate transistor in a bit-side data access circuit, and a passgate transistor in a bit-bar-side data access circuit, if present, in the addressed SRAM cell.

In realizations of the read operation which are part of test operations, following execution of step (3050), step (3052) is executed, which is to determine if a potential on the bit-side data node was successfully transferred to a bit data line of the addressed SRAM cell and to determine if there was a data upset in the half-addressed SRAM cell. If the potential on the bit-side data node was successfully transferred to the bit data line of the addressed SRAM cell and there was no data upset in the half-addressed SRAM cell then step (3054) is executed, which is to record a successful read operation for the addressed SRAM cell. If the potential on the bit-side data node was not successfully transferred to the bit data line or there was a data upset in the half-addressed SRAM cell then step (3056) is executed, which is to record a failed read operation for the addressed SRAM cell. After step (3054) or step (3056) is executed, or after step (3050) is executed in realizations which are not part of test operations, the read operation is ended (3058). In other realizations of the read operation, steps (3042), (3044), (3046) and (3048) may be performed in any order.

Figure 3D:
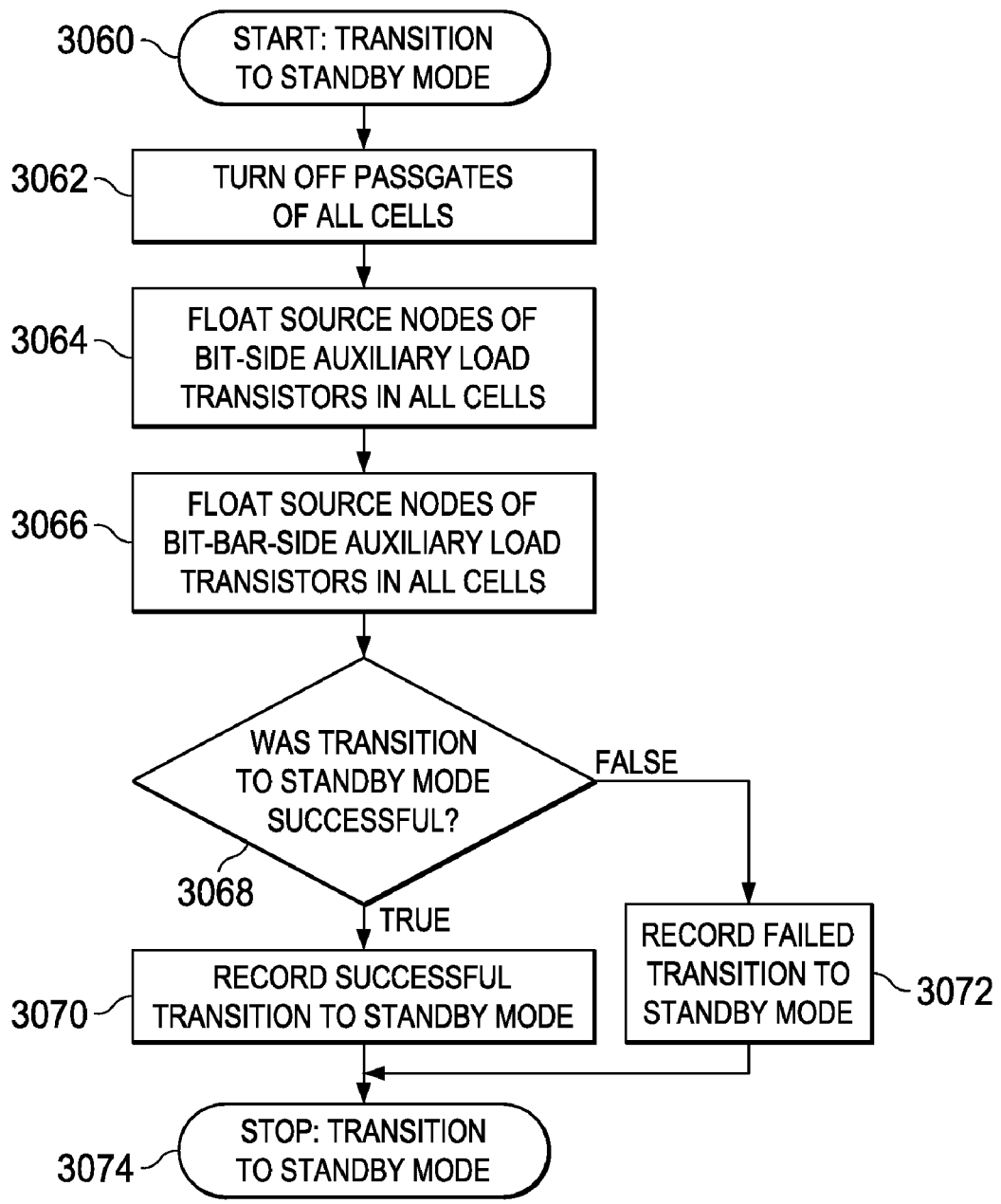

Referring to FIG. 3D, the transition to standby mode operation begins (3060) with step (3062) which is to turn off passgates of all SRAM cells. Step (3064) is executed, which is to float the source nodes of bit-side auxiliary load transistors in all SRAM cells. Step (3066) is executed, which is to float the source nodes of bit-bar-side auxiliary load transistors in all SRAM cells. In realizations of the transition to standby mode operation which are part of test operations, such as measurements of leakage currents in SRAM cell arrays, following execution of step (3066), step (3068) is executed, which is to determine if the transition to standby mode was successful, for example if leakage currents were below target values.

If the transition to standby mode was successful then step (3070) is executed, which is to record a successful transition to standby mode operation for the SRAM cell array. If the transition to standby mode was not successful then step (3072) is executed, which is to record a failed transition to standby mode operation for the SRAM cell array. After step (3070) or step (3072) is executed, or after step (3066) is executed in realizations which are not part of test operations, the transition to standby mode operation is ended (3074). In other realizations of the transition to standby mode operation, steps (3064) and (3066) may be performed in any order.

Figure 3E:
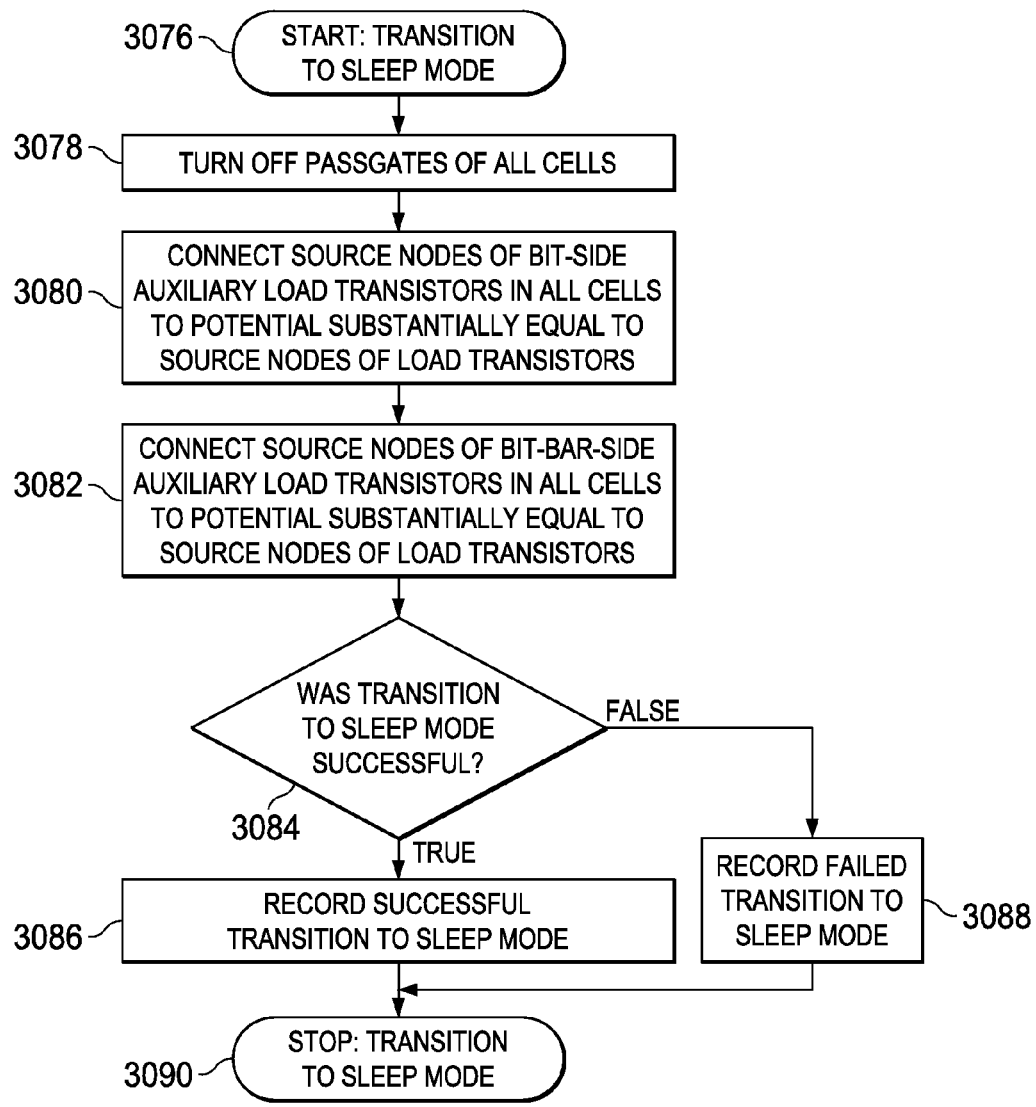

Referring to FIG. 3E, the transition to sleep mode operation begins (3076) with step (3078) which is to turn off passgates of all SRAM cells. Step (3080) is executed, which is to connect the source nodes of bit-side auxiliary load transistors in all SRAM cells to a potential substantially equal to a potential of source nodes of load transistors in the SRAM cells. Step (3082) is executed, which is to connect the source nodes of bit-bar-side auxiliary load transistors in all SRAM cells to a potential substantially equal to a potential of source nodes of load transistors in the SRAM cells. Steps (3080) and (3082) may be repeated if the potential of the source nodes of the load transistors in the SRAM cells is changed (during the transition to sleep mode operation, for example) in cases in which the potential of source nodes of load transistors in the SRAM cells is incrementally lowered in several stages to enhance data retention.

In realizations of the transition to sleep mode operation which are part of test operations, such as measurements of power consumption in SRAM cell arrays, following execution of step (3082), step (3084) is executed, which is to determine if the transition to sleep mode was successful, for example if power consumption was below target values. If the transition to sleep mode was successful then step (3086) is executed, which is to record a successful transition to sleep mode operation for the SRAM cell array. If the transition to standby mode was not successful then step (3088) is executed, which is to record a failed transition to standby mode operation for the SRAM cell array. After step (3086) or step (3088) is executed, or after step (3082) is executed in realizations which are not part of test operations, the transition to standby mode operation is ended (3090). In other realizations of the transition to standby mode operation, steps (3080) and (3082) may be performed in any order.

Figure 4:
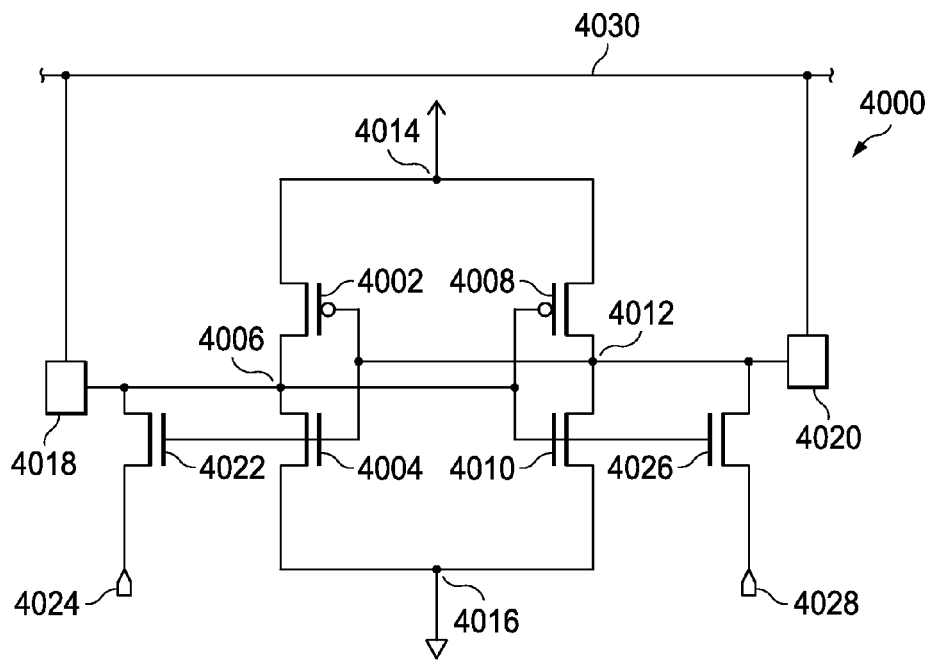
FIG. 4 is a circuit diagram of an SRAM cell with PMOS driver transistors and NMOS load transistors in an SRAM cell array.

It will be recognized by those familiar with SRAM design and fabrication that the advantages of the realizations as described in reference to FIG. 2 and FIG. 3A through FIG. 3E may also be attained in integrated circuits containing arrays of SRAM cells with PMOS driver transistors, NMOS load transistors, and NMOS auxiliary load transistors. For example, FIG. 4 is a circuit diagram of an SRAM cell (4000) in an SRAM cell array contained in an integrated circuit. The SRAM cell (4000) contains NMOS auxiliary load transistors (4022) and (4026) (instead of the PMOS auxiliary load transistors (2026) and (2030) shown in FIG. 2). The SRAM cell (4000) includes a PMOS bit driver (4002) and an NMOS bit load (4004). A drain node of the bit driver (4002) and a drain node of the bit load (4004) are connected to a bit-side data node (4006). The SRAM cell (4000) also includes a PMOS bit-bar driver (4008) and an NMOS bit-bar load transistor (4010). A drain node of the bit-bar driver (4008) and a drain node of the bit-bar load (4010) are connected to a bit-bar-side data node (4012). A source node of the bit driver (4002) and a source node of the bit-bar driver (4008) are connected to a Vdd node (4014). A source node of the bit load (4004) and a source node of the bit-bar load (4010) are connected to a Vss node (4016). A gate node of the bit driver (4002) and a gate node of the bit load (4004) are connected to the bit-bar-side data node (4012). Similarly, a gate node of the bit-bar driver (4008) and a gate node of the bit-bar load (4010) are connected to the bit-side data node (4006).

The bit-side data node (4006) is connected to a bit-side data access circuit (4018), which may include one or more passgate transistors and possibly one or more read buffers, connected to one or more bit lines (not shown). Similarly, the bit-bar-side data node (4012) may be connected to an optional bit-bar-side data access circuit (4020), which may include one or more passgate transistors and possibly one or more read buffers, connected to one or more bit-bar lines (not shown). A word line (4030) is connected to the bit-side data access circuit (4018) and the bit-bar-side data access circuit (4020), if present.

The SRAM cell (4000) also includes an NMOS bit-side auxiliary load transistor (4022). A drain node of the bit-side auxiliary load transistor (4022) is connected to the bit-side data node (4006). A gate node of the bit-side auxiliary load transistor (4022) is connected to the bit-bar-side data node (4012). A source node (4024) of the bit-side auxiliary load transistor (4022) is connected to other source nodes of other bit-side auxiliary load transistors in a same column as the SRAM cell (4000).

The SRAM cell (4000) also includes an NMOS bit-bar-side auxiliary load transistor (4026). A drain node of the bit-bar-side auxiliary load transistor (4026) is connected to the bit-bar-side data node (4012). A gate node of the bit-side auxiliary load transistor (4026) is connected to the bit-side data node (4006). A source node (4028) of the bit-bar-side auxiliary load transistor (4026) is connected to other source nodes of other bit-bar-side auxiliary load transistors in a same column as the SRAM cell (4000).

In one embodiment, a sum of on-state currents of the bit load (4004) and the bit-side auxiliary load transistor (4022) is substantially equal to an on-state current of the bit driver (4002). Similarly, a sum of on-state currents of the bit-bar load (4010) and the bit-bar-side auxiliary load transistor (4026) is substantially equal to an on-state current of the bit-bar driver (4008). In another embodiment, the driver transistors (4002, 4008) and the load transistors (4004, 4010) are a minimum width consistent with fabrication methods used to manufacture the SRAM cell array. Minimizing driver and load transistor widths may reduce a size of the SRAM cell (4000) and thereby may reduce manufacturing costs of the integrated circuit.

The write low, write high, read, transition to standby mode and transition to sleep mode operations are performed on an SRAM cell array containing SRAM cells with NMOS auxiliary load transistors as described in reference to FIG. 4, using the processes recited in reference to FIG. 3A through FIG. 3E, with appropriate changes in polarity of bias potentials.

Figure 5:
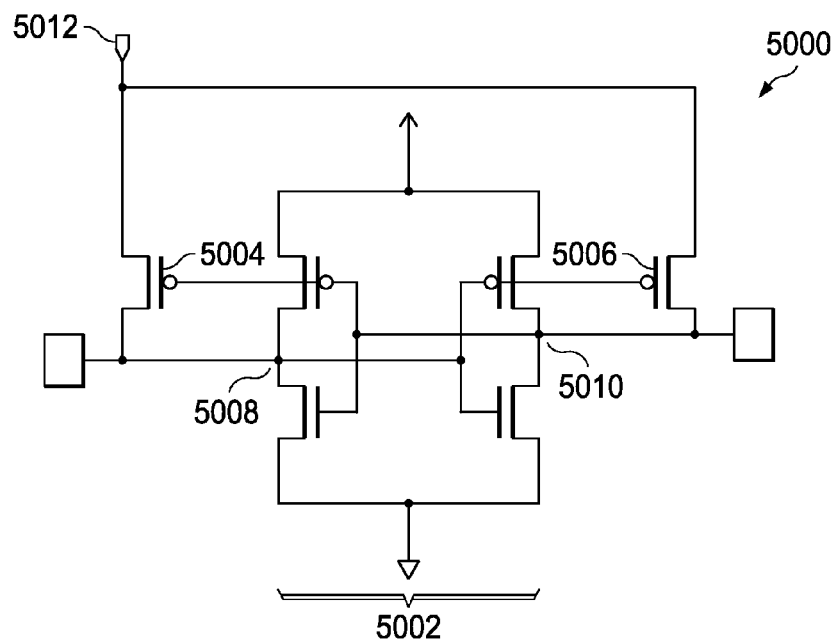
FIG. 5 depicts an SRAM cell in which a source node of a bit-side auxiliary load transistor and a source node of a bit-bar-side auxiliary load transistor are directly electrically connected in each SRAM cell.

In some realizations, source nodes of bit-side auxiliary load transistors and source nodes of bit-bar-side auxiliary load transistors may be directly electrically connected in each SRAM cell. FIG. 5 depicts this embodiment for an SRAM cell (5000) containing NMOS drivers and PMOS loads (5002), as described in reference to FIG. 2. The SRAM cell (5000) includes a PMOS bit-side auxiliary load transistor (5004) and a PMOS bit-bar-side auxiliary load transistor (5006). Drain nodes of the PMOS bit-side auxiliary load transistor (5004) and PMOS bit-bar-side auxiliary load transistor (5006) are connected to a bit-side data node (5008) and a bit-bar-side data node (5010), respectively, of the SRAM cell (5000), as described in reference to FIG. 2. A source node of the PMOS bit-side auxiliary load transistor (5004) and a source node of the PMOS bit-bar-side auxiliary load transistor (5006) are connected to a common auxiliary transistor source node (5012) contained in the SRAM cell (5000). The common auxiliary transistor source node (5012) is connected to other common auxiliary transistor source nodes in other SRAM cells in a same column as the SRAM cell (5000). During write low, write high, read, transition to standby mode and transition to sleep mode operations described in FIG. 3A through FIG. 3E, the source node of the PMOS bit-side auxiliary load transistor (5004) and the source node of the PMOS bit-bar-side auxiliary load transistor (5006) are biased together. Connecting the source node of the PMOS bit-side auxiliary load transistor (5004) and the source node of the PMOS bit-bar-side auxiliary load transistor (5006) to a common auxiliary transistor source node (5012) within the SRAM cell (5000) may reduce an area required for the SRAM cell (5000), and thereby may reduce manufacturing costs of an integrated circuit containing the SRAM cell (5000).

It will be recognized by those familiar with SRAM design and fabrication that the advantages of the embodiment as described in reference to FIG. 5 may be attained in integrated circuits containing arrays of SRAM cells with PMOS driver transistors, NMOS load transistors, and NMOS auxiliary load transistors. Write low, write high, read, transition to standby mode and transition to sleep mode operations are performed on an SRAM cell array containing SRAM cells with NMOS auxiliary load transistors as described in reference to FIG. 4, with source nodes of the auxiliary transistors connected to a common auxiliary transistor source node within the SRAM cell, using the processes recited in reference to FIG. 3A through FIG. 3E with appropriate changes in polarity of bias potentials.

Figure 6:
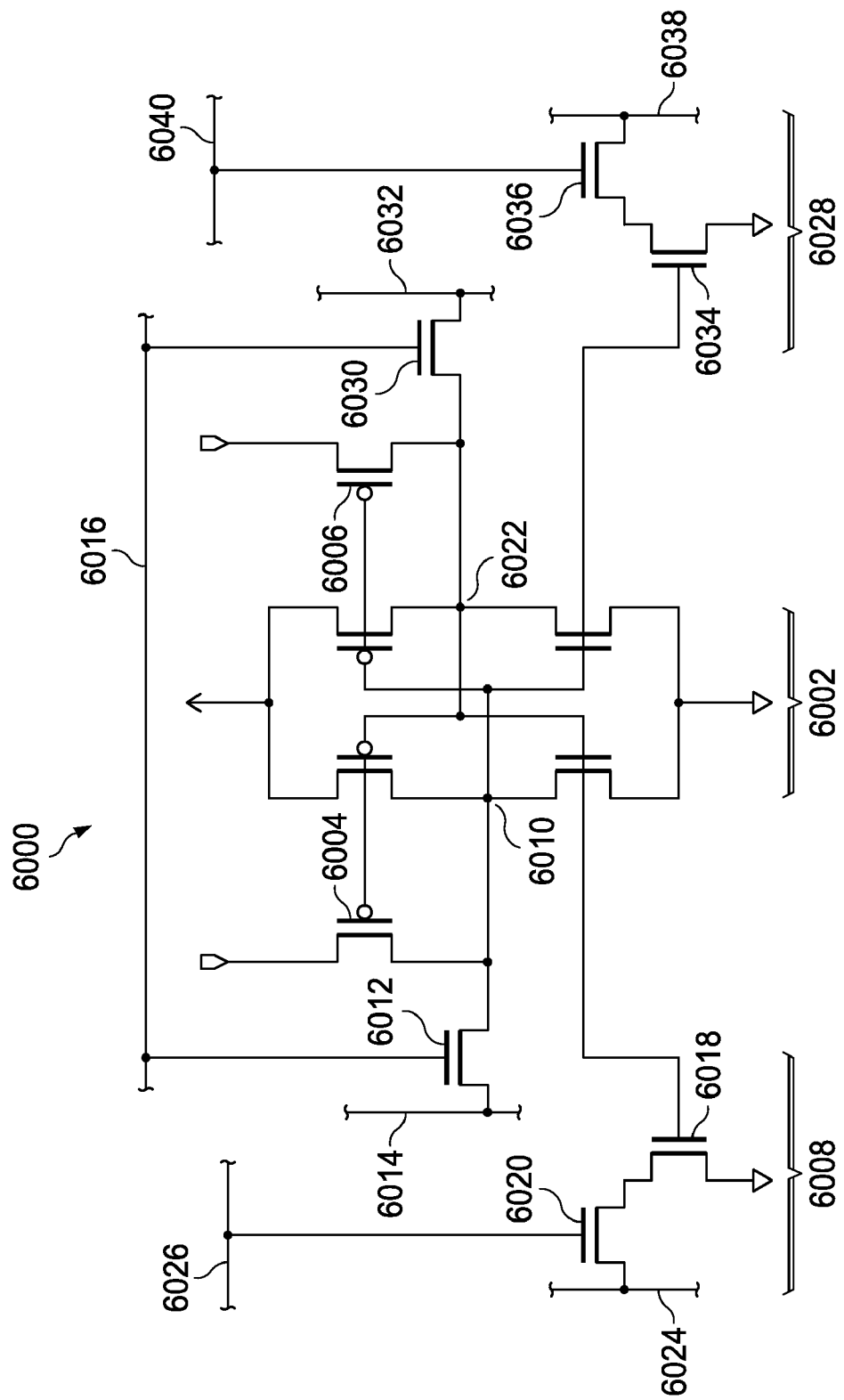
FIG. 6 depicts an SRAM cell containing various data access circuits.

It is within the scope of the instant invention to form integrated circuits with SRAM cells containing any of various data access circuits. For example, FIG. 6 depicts an SRAM cell (6000) containing NMOS drivers and PMOS loads (6002), as described in reference to FIG. 2. The SRAM cell (6000) further includes a PMOS bit-side auxiliary load transistor (6004) and a PMOS bit-bar-side auxiliary load transistor (6006), configured as described in reference to FIG. 2.

A bit-side data access circuit (6008) connected to a bit-side data node (6010) includes a bit-side passgate transistor (6012). A first source/drain node of the bit-side passgate transistor (6012) is connected to the bit-side data node (6010). A second source/drain node of the bit-side passgate transistor (6012) is connected to a first bit line (6014). A gate node of the bit-side passgate transistor (6012) is connected to a first word line (6016).

The bit-side data access circuit (6008) may also contain an optional bit-side read buffer that includes a bit-side read buffer driver transistor (6018) and a bit-side read buffer access transistor (6020). A gate node of the bit-side read buffer driver transistor (6018) is connected to a bit-bar-side data node (6022). A source node of the bit-side read buffer driver transistor (6018) is connected to Vss. A drain node of the bit-side read buffer driver transistor (6018) is connected to a drain node of the bit-side read buffer access transistor (6020). A source node of the bit-side read buffer access transistor (6020) is connected to an optional read bit line (6024). A gate node of the bit-side read buffer access transistor (6020) is connected to an optional bit-side read word line (6026). In other realizations, the source node of the bit-side read buffer access transistor (6020) may be connected to the first bit line (6014). In further realizations, additional combinations of passgate transistors and bit lines (commonly known as ports) may be included in the bit-side data access circuit (6008). In yet further realizations, additional combinations of read buffers and read bit lines may be included in the bit-side data access circuit (6008).

An optional bit-bar-side data access circuit (6028) may be connected to a bit-bar-side data node (6022). The optional bit-bar-side data access circuit (6028) may contain an optional bit-bar-side passgate transistor (6030) and optional bit-bar data line (6032), configured similarly to the bit-side passgate transistor (6012) and the first bit line (6014). The optional bit-bar-side data access circuit (6028) may also contain an optional bit-bar-side read buffer containing a bit-bar-side read buffer driver transistor (6034), a bit-bar-side read buffer access transistor (6036), an optional bit-bar read bit line (6038) and an optional bit-bar-side read word line (6040), configured similarly to the bit-side read buffer. In other realizations, the optional bit-bar-side data access circuit (6028) may include additional port or read buffers.

It will be recognized by those familiar with SRAM design and fabrication that realizations of bit-side and bit-bar-side data access circuits described in reference to FIG. 6 may be applied to SRAM cells containing PMOS drivers, NMOS loads and NMOS auxiliary load transistors, with appropriate changes in polarities of transistors in the bit-side and bit-bar-side data access circuits.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit containing an array of SRAM cells arranged in rows and columns, each of said SRAM cells comprising:
   a bit-side driver transistor within said each of said SRAM cells of said integrated circuit, said bit-side driver transistor including a gate node, a source node and a drain node;
   a bit-side data node, wherein said bit-side data node is connected to said drain node of said bit-side driver transistor;
   a bit-side load transistor, said bit-side load transistor including a gate node, a source node and a drain node, wherein said drain node of said bit-side load transistor is connected to said bit-side data node;
   a bit-bar-side driver transistor, said bit-bar-side driver transistor including a gate node, a source node and a drain node, wherein said gate node of said bit-bar-side driver transistor is connected to said bit-side data node;
   a bit-bar-side data node, wherein said bit-bar-side data node is connected to said drain node of said bit-bar-side driver transistor, to said gate node of said bit-side driver transistor and to said gate node of said bit-side load transistor;
   a bit-bar-side load transistor, said bit-bar-side load transistor including a gate node, a source node and a drain node, wherein said drain node of said bit-bar-side load transistor is connected to said bit-bar-side data node, and said gate node of said bit-bar-side load transistor is connected to said bit-side data node;
   a bit-side auxiliary load transistor, said bit-side auxiliary load transistor including a gate node, a source node and a drain node, wherein said drain node of said bit-side auxiliary load transistor is connected to said bit-side data node, and said gate node of said bit-side auxiliary load transistor is connected to said bit-bar-side data node; and
   a bit-bar-side auxiliary load transistor, said bit-bar-side auxiliary load transistor including a gate node, a source node and a drain node, wherein said drain node of said bit-bar-side auxiliary load transistor is connected to said bit-bar-side data node, and said gate node of said bit-bar-side auxiliary load transistor is connected to said bit-side data node.

2. The integrated circuit of claim 1, wherein:
   said source node of said bit-side auxiliary load transistor is connected to said source nodes of other said bit-side auxiliary load transistors in a same said column of said SRAM cells;
   said source node of said bit-bar-side auxiliary load transistor is connected to said source nodes of other said bit-bar-side auxiliary load transistors in a same said column of said SRAM cells; and
   an auxiliary load transistor bias circuit is coupled to said array of SRAM cells, said auxiliary load transistor bias circuit being capable of biasing said bit-side auxiliary load transistor and said bit-bar-side auxiliary load transistor in an addressed SRAM cell located within said array of SRAM cells independently of said bit-side auxiliary load transistor and said bit-bar-side auxiliary load transistor in a half-addressed SRAM cell located within said array of SRAM cells.

3. The integrated circuit of claim 2, in which said source node of said bit-side auxiliary load transistor is electrically connected to said source node of said bit-bar-side auxiliary load transistor within said SRAM cells.

4. The integrated circuit of claim 2, in which said auxiliary load transistor bias circuit is capable of biasing said source node of said bit-side auxiliary load transistor independently of said source node of said bit-bar-side auxiliary load transistor in said addressed SRAM cell.

5. The integrated circuit of claim 2, in which:
   said bit-side driver transistor is NMOS;
   said bit-bar-side driver transistor is NMOS;
   said bit-side load transistor is PMOS;
   said bit-bar-side load transistor is PMOS;
   said bit-side auxiliary load transistor is PMOS;
   said bit-bar-side auxiliary load transistor is PMOS;
   said auxiliary load transistor bias circuit being capable of biasing said source node of said bit-side auxiliary load transistor and said source node of said bit-bar-side auxiliary load transistor in said half-addressed SRAM cell to substantially Vdd during a write low operation and during a write high operation; and
   said auxiliary load transistor bias circuit being capable of biasing said source node of said bit-side auxiliary load transistor and said source node of said bit-bar-side auxiliary load transistor in said addressed SRAM cell to substantially Vdd while biasing said source node of said bit-side auxiliary load transistor and said source node of said bit-bar-side auxiliary load transistor in said half-addressed SRAM cell to substantially Vdd during a read operation.

6. The integrated circuit of claim 2, in which:
   said bit-side driver transistor is PMOS;
   said bit-bar-side driver transistor is PMOS;
   said bit-side load transistor is NMOS;
   said bit-bar-side load transistor is NMOS;
   said bit-side auxiliary load transistor is NMOS;
   said bit-bar-side auxiliary load transistor is NMOS;
   said auxiliary load transistor bias circuit being capable of biasing said source node of said bit-side auxiliary load transistor and said source node of said bit-bar-side auxiliary load transistor in said half-addressed SRAM cell to substantially Vss during a write low operation and during a write high operation; and
   said auxiliary load transistor bias circuit being capable of biasing said source node of said bit-side auxiliary load transistor and said source node of said bit-bar-side auxiliary load transistor in said addressed SRAM cell to substantially Vss while biasing said source node of said bit-side auxiliary load transistor and said source node of said bit-bar-side auxiliary load transistor in said half-addressed SRAM cell to substantially Vss during a read operation.

7. The integrated circuit of claim 1, in which said each of said SRAM cells contain a bit-side passgate transistor, said bit-side passgate transistor including a gate node, a first source/drain node and a second source/drain node, wherein said gate node of said bit-side passgate transistor is connected to a word line, said first source/drain node of said bit-side passgate transistor is connected to said bit-side data node, and said second source/drain node of said bit-side passgate transistor is connected to a bit line.

8. The integrated circuit of claim 7, in which said each of said SRAM cells contain a bit-bar-side passgate transistor, said bit-bar-side passgate transistor including a gate node, a first source/drain node and a second source/drain node, wherein said gate node of said bit-bar-side passgate transistor is connected to said word line, said first source/drain node of said bit-bar-side passgate transistor is connected to said bit-bar-side data node, and said second source/drain node of said bit-bar-side passgate transistor is connected to a bit-bar line.

9. The integrated circuit of claim 7, in which said each of said SRAM cells further includes a bit-bar-side read buffer.

10. The integrated circuit of claim 9, in which said each of said SRAM cells further includes a bit-side read buffer.

11. A process of operating an integrated circuit containing an array of SRAM cells arranged in rows and columns, comprising:
performing a write low operation on an addressed SRAM cell, comprising:
biasing a source node of a bit-side auxiliary load transistor in a half-addressed SRAM cell to substantially a same potential as a source node of a bit-side load transistor in said half-addressed SRAM cell; and
biasing a source node of a bit-bar-side auxiliary load transistor in said half-addressed SRAM cell to substantially a same potential as a source node of a bit-bar-side load transistor in said half-addressed SRAM cell;
performing a write high operation on said addressed SRAM cell, composing:
biasing said source node of said bit-side auxiliary load transistor in said half-addressed SRAM cell to substantially a same potential as said source node of said bit-side load transistor in said half-addressed SRAM cell; and
biasing said source node of said bit-bar-side auxiliary load transistor in said half-addressed SRAM cell to substantially a same potential as said source node of said bit-bar-side load transistor in said half-addressed SRAM cell;
performing a read operation on said addressed SRAM cell, comprising:
biasing said source node of said bit-side auxiliary load transistor in said half-addressed SRAM cell to substantially a same potential as said source node of said bit-side load transistor in said half-addressed SRAM cell; and
biasing said source node of said bit-bar-side auxiliary load transistor in said half-addressed SRAM cell to substantially a same potential as said source node of said bit-bar-side load transistor in said half-addressed SRAM cell.

12. The process of claim 11, in which said step of performing said write low operation further includes a step of biasing a source node of a bit-side auxiliary load transistor in said addressed SRAM cell substantially to Vss.

13. The process of claim 11, in which said step of performing said write low operation further includes a step of floating a source node of a bit-side auxiliary load transistor in said addressed SRAM cell.

14. The process of claim 11, in which said step of performing said write low operation further includes a step of biasing a source node of a bit-bar-side auxiliary load transistor in said addressed SRAM cell substantially to Vdd.

15. The process of claim 11, in which said step of performing said write low operation further includes a step of floating a source node of a bit-bar-side auxiliary load transistor in said addressed SRAM cell.

16. The process of claim 11, in which said step of performing said read operation further includes steps:
biasing a source node of a bit-side auxiliary load transistor in said addressed SRAM cell to substantially a same potential as a source node of a bit-side load transistor in said addressed SRAM cell; and
biasing a source node of a bit-bar-side auxiliary load transistor in said addressed SRAM cell to substantially a same potential as a source node of a bit-bar-side load transistor in said addressed SRAM cell.

17. The process of claim 11, in which:
a bit-side driver transistor in said half-addressed SRAM cell is NMOS;
a bit-bar-side driver transistor in said half-addressed SRAM cell is NMOS;
said bit-side load transistor in said half-addressed SRAM cell is PMOS;
said bit-bar-side load transistor in said half-addressed SRAM cell is PMOS;
said bit-side auxiliary load transistor in said half-addressed SRAM cell is PMOS; and
said bit-bar-side auxiliary load transistor in said half-addressed SRAM cell is PMOS.

18. The process of claim 11, in which:
a bit-side driver transistor in said half-addressed SRAM cell is PMOS;
a bit-bar-side driver transistor in said half-addressed SRAM cell is PMOS;
said bit-side load transistor in said half-addressed SRAM cell is NMOS;
said bit-bar-side load transistor in said half-addressed SRAM cell is NMOS;
said bit-side auxiliary load transistor in said half-addressed SRAM cell is NMOS; and
said bit-bar-side auxiliary load transistor in said half-addressed SRAM cell is NMOS.

19. The process of claim 11, in which said performing said write low operation further comprises:
determining if a low voltage was successfully transferred to a bit-side data node in said addressed SRAM cell; and
determining if a data upset occurred in said half-addressed SRAM cell.

20. The process of claim 11, in which said performing said read operation further comprises:
determining if a potential on a bit-side data node was successfully transferred to a bit line of said addressed SRAM cell; and
determining if a data upset occurred in said half-addressed SRAM cell.

* * * * *